(12) United States Patent
Sommer et al.

(10) Patent No.: US 11,588,318 B2
(45) Date of Patent: Feb. 21, 2023

(54) SENSOR-BASED REMOTE CONDITION MONITORING DEVICE AND METHOD FOR DISCONNECTOR DEVICES

(71) Applicant: Hitachi Energy Switzerland AG, Baden (CH)

(72) Inventors: Philipp Sommer, Zürich (CH); Xavier Kornmann, Lauchringen (DE); Daniel Neeser, Thalwil (CH); Stefano Bertoli, Wettingen (CH); Ektor Sotiropoulos, Horgen (CH); Martin Schick-Pauli, Zürich (CH); Gian-Luigi Madonna, Otelfingen (CH); Alexander Fach, Boppelsen (CH); Yannick Maret, Dättwil (CH)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/437,999

(22) PCT Filed: Mar. 11, 2019

(86) PCT No.: PCT/EP2019/056012
§ 371 (c)(1),
(2) Date: Sep. 10, 2021

(87) PCT Pub. No.: WO2020/182286
PCT Pub. Date: Sep. 17, 2020

(65) Prior Publication Data
US 2022/0190589 A1    Jun. 16, 2022

(51) Int. Cl.
*H01C 7/12*    (2006.01)
*H02H 1/00*    (2006.01)
(Continued)

(52) U.S. Cl.
CPC ............... *H02H 3/22* (2013.01); *G01R 31/74* (2020.01); *H02H 1/0061* (2013.01); *H02H 3/04* (2013.01);
(Continued)

(58) Field of Classification Search
CPC .......... H02H 3/04; H02H 3/22; H02H 1/0061; H02J 13/00002; H02J 13/00022; H02J 13/0004; G01R 31/74
(Continued)

(56) References Cited

U.S. PATENT DOCUMENTS 4,740,859 A * 4/1988 Little .................... H02H 3/048
361/111
5,991,141 A   11/1999 Mikli et al.
(Continued)

FOREIGN PATENT DOCUMENTS

CN   102185287 A   9/2011
CN   106291201 A   1/2017
(Continued)

OTHER PUBLICATIONS

Chinese First Office Action dated Dec. 24, 2021 for Chinese Patent Application No. 201980093913.3, 10 pages.
(Continued)

*Primary Examiner* — Jared Fureman
*Assistant Examiner* — Lucy M Thomas
(74) *Attorney, Agent, or Firm* — Sage Patent Group

(57) ABSTRACT

A device, a method and a system for monitoring an electrical connection status of a disconnector device are disclosed. The disconnector device is connectable to pole-mounted equipment in a power distribution or transmission grid, thereby disconnecting the pole-mounted equipment. The connection status monitoring device includes a determining section configured to determine whether the disconnector device has (Continued)

been activated and to generate connection status indicator data, indicative of whether the disconnector device has been activated. The determining section further includes a wireless communication section which is adapted to connect to a wireless communication infrastructure using a wireless communication protocol, and to transmit the connection status indicator data over the wireless communication infrastructure.

14 Claims, 5 Drawing Sheets

(51) Int. Cl.
    *H02H 1/04*         (2006.01)
    *H02H 3/22*         (2006.01)
    *H02H 9/06*         (2006.01)
    *H04W 76/10*       (2018.01)
    *H02J 13/00*       (2006.01)
    *G01R 31/74*       (2020.01)
    *H02H 3/04*         (2006.01)
    *H04W 24/10*       (2009.01)
    *H04W 64/00*       (2009.01)
(52) U.S. Cl.
    CPC .... *H02J 13/00002* (2020.01); *H02J 13/0004* (2020.01); *H02J 13/00022* (2020.01); *H04W 24/10* (2013.01); *H04W 64/00* (2013.01); *H04W 76/10* (2018.02)
(58) Field of Classification Search
    USPC ........................................................ 361/118
    See application file for complete search history.

(56) References Cited

U.S. PATENT DOCUMENTS

| | | | |
|---|---|---|---|
| 2008/0100436 A1 | 5/2008 | Banting et al. | |
| 2017/0222426 A1* | 8/2017 | Mao | H02H 3/20 |
| 2018/0331571 A1* | 11/2018 | Smit | H02J 13/0013 |
| 2019/0140443 A1 | 5/2019 | Brocke | |
| 2020/0303950 A1* | 9/2020 | Roberts | H02H 1/063 |

FOREIGN PATENT DOCUMENTS

| | | |
|---|---|---|
| CN | 107482780 A | 12/2017 |
| CN | 108732461 A | 11/2018 |
| CN | 109066995 A | 12/2018 |
| CN | 109298328 A | 2/2019 |
| DE | 102016011076 A1 | 10/2017 |
| WO | 2010144465 A1 | 12/2010 |

OTHER PUBLICATIONS

International Search Report and Written Opinion of the International Searching Authority, PCT/EP2019/056012, dated Nov. 27, 2019, 15 pages.

International Preliminary Report on Patentability of the International Preliminary Examining Authority, PCT/EP2019/056012, dated Jun. 16, 2021, 15 pages.

Chinese Second Office Action dated May 20, 2022 for Chinese Patent Application No. 201980093913.3, 14 pages (including English translation).

\* cited by examiner

SENSOR-BASED REMOTE CONDITION MONITORING DEVICE AND METHOD FOR DISCONNECTOR DEVICES

CROSS REFERENCE TO RELATED APPLICATIONS

This application is a 35 U.S.C. § 371 national stage application of PCT International Application No. PCT/EP2019/056012 filed on Mar. 11, 2019, the disclosure and content of which is incorporated by reference herein in its entirety.

FIELD

The inventive concepts are in the field of monitoring devices in a power grid. In particular, some embodiments provide devices and methods for monitoring a disconnector device provided in a power distribution grid. The disconnector device can in particular be a disconnector, e.g., a fuse element, to disconnect pole-mounted equipment, such as a surge arrester or a distribution transformer, from the power grid in case of an overload.

BACKGROUND

Specific pole mounted equipment may be used to protect a power grid or attached devices, to which the pole mounted equipment is connected. Such pole-mounted protection equipment may, for example, be surge arresters, which can be considered as important protection devices in electrical network and protect expensive equipment, such as distribution transformers, against overvoltage surge by locally limiting energy of the overvoltage surge. In some embodiments, they are installed in group of three on three-phase poles that have a phase-to-ground connection. Another example for pole-mounted equipment are the distribution transformers themselves.

The surge arrester can absorb a limited amount of energy and it may fail after a certain number of protection events and/or a certain overload (e.g. amount and/or duration of an overcurrent). The surge arrester may typically fail by thermal overload which means that the surge arrester may overheat and in extreme cases emit sparks and/or even explode.

To limit such a risk, disconnector devices have been developed, so-called spark prevention units (SPU), whose objective is to disconnect, in a spark-safe way, the surge arrester before a failure occurs. These disconnector devices may reduce the above-mentioned risk by disconnecting the surge arrester before thermal overload. Once disconnected, the surge arrester is removed from the electrical network. There may be a local visual indicator on the SPU that visualizes that the SPU has disconnected (tripped) but there is currently no remote monitoring thereof.

If a utility network like a power grid or a power distribution network is comprising a large number of disconnector devices including SPUs (typically tens to hundreds of thousands), it becomes cumbersome to determine if these are all still connected. Presently, it is required to send out a service crew that visually inspects each and every disconnector device. This is a time intensive task: a given SPU may therefore be inspected only once every year or even less often. A disconnected SPU could thus be in the network for a long period of time. That means, that in this location no protection against surge is available, since the surge arrester has been disconnected from the power grid. Analogous considerations also apply for other pole-mounted equipment such as for fuse cutouts that protect distribution transformers against overload.

To improve the situation, it is therefore desirable to provide devices and methods which may allow a more frequent and/or less cumbersome status monitoring of such protection devices.

SUMMARY

In order to address the foregoing and other potential problems, embodiments of the present disclosure propose:

In a first aspect, a connection status monitoring device for monitoring an electrical connection status of a disconnector device may be disclosed. The disconnector device being connectable to pole-mounted equipment in a power distribution or transmission grid, thereby disconnecting the pole-mounted equipment, the connection status monitoring device comprising: a determining section configured to determine whether the disconnector device has been activated, in other words, if the disconnector device is in a state in which it has interrupted the connection between a phase of the grid and ground, and to generate connection status indicator data, indicative of whether the disconnector device has been activated; and a wireless communication section adapted to connect to a wireless communication infrastructure using a wireless communication protocol, and to transmit the connection status indicator data over the wireless communication infrastructure.

In another aspect, a connection status monitoring system may be disclosed, comprising the connection status monitoring device according to other aspects and a central control unit connected to the wireless communication infrastructure using the wireless communication protocol and adapted to receive the connection status indicator data, transmitted by the wireless communication section.

In another aspect, a protection disconnector system for disconnecting a pole-mounted equipment in a power distribution or transmission grid may be disclosed. The protection disconnector system may comprise a disconnector device, being connectable to the pole-mounted equipment and being configured for disconnecting, upon activation of the disconnector device, the pole-mounted equipment in case of an overload condition; and the connection status monitoring device according to other aspects or the connection status monitoring system according to other aspects, the connection status monitoring device being operatively connected to the disconnector device for monitoring an electrical connection status of the disconnector device.

In another aspect, a grid protection system may be disclosed which may comprise a pole-mounted equipment, connected to a power distribution or transmission grid; and the protection disconnector system according to any other aspects, wherein the disconnector device may be electrically connected to the pole-mounted equipment and may be configured for disconnecting, upon activation of the disconnector device, the pole-mounted equipment in case of an overload condition.

In another aspect, a method for remotely monitoring an electrical connection status of a disconnector device may be disclosed. The disconnector device may be connectable to a pole-mounted equipment in a power distribution or transmission grid and may further be configured for being activated in case of an overload condition, thereby disconnecting the pole-mounted equipment. The method may comprise: Determining, by a determining section of the connection status monitoring device, whether the disconnector device has been activated; generating, by the determining section, connection status indicator data indicative of whether the disconnector device has been activated. The method may further comprise: Transmitting, by a wireless communication section of the connection status monitoring device, connected to a wireless communication infrastructure, the connection status indicator data over the wireless communication infrastructure using a wireless communication protocol.

BRIEF DESCRIPTION OF DRAWINGS

Embodiments of the present disclosure will be presented in the sense of examples and their advantages are explained in greater detail below, with reference to the accompanying drawings, wherein.

DETAILED DESCRIPTION OF DRAWINGS AND EMBODIMENTS

Figure 1:
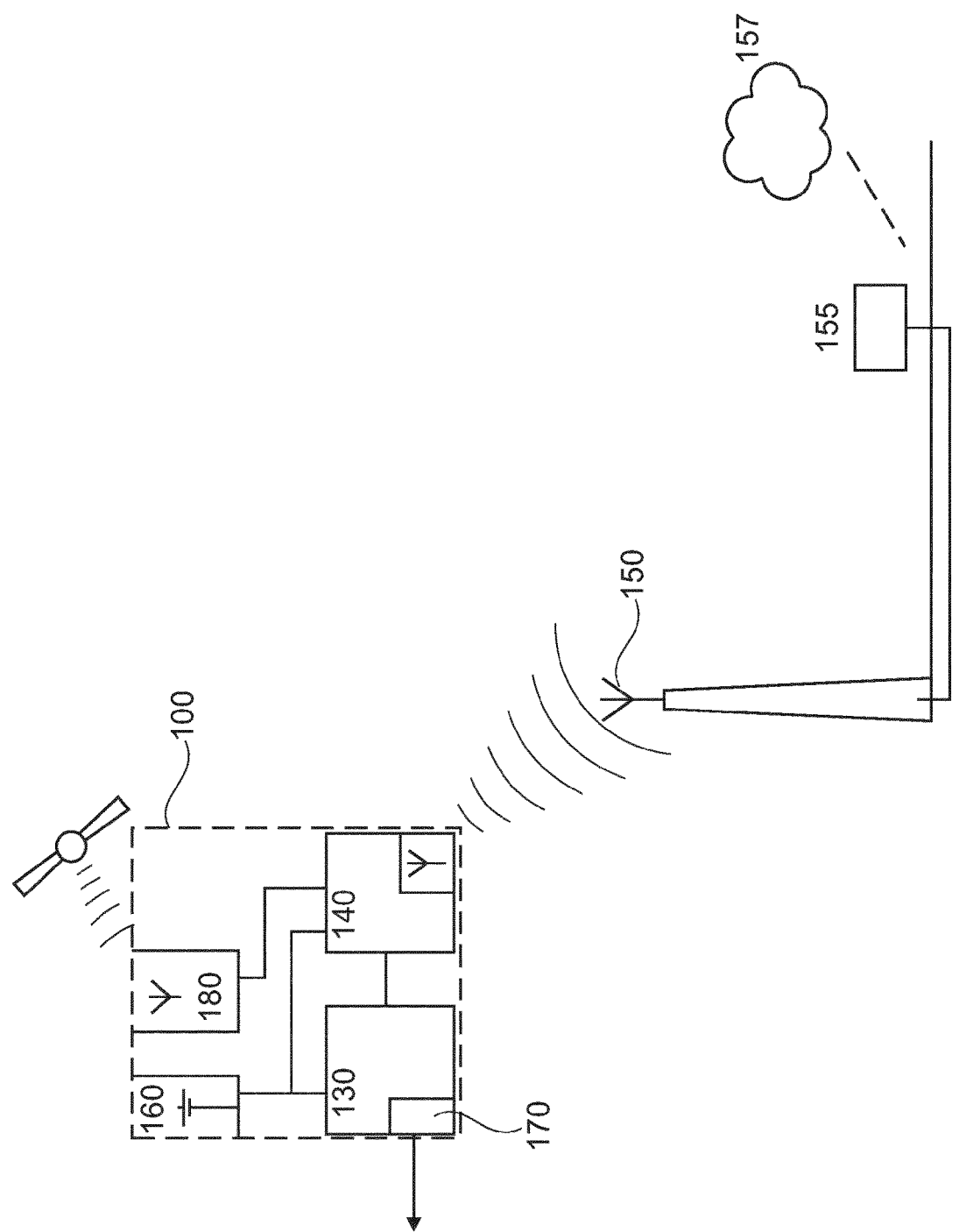
FIG. 1 schematically shows a block diagram according to embodiments.

The disclosed subject matter will now be described with reference to the attached figures. Various structures, systems and devices are schematically depicted in the drawings for purposes of explanation only and so as to not obscure the description with details that are well known to those skilled in the art. Nevertheless, the attached drawings are included to describe and explain illustrative examples of the disclosed subject matter.

Figure 2:
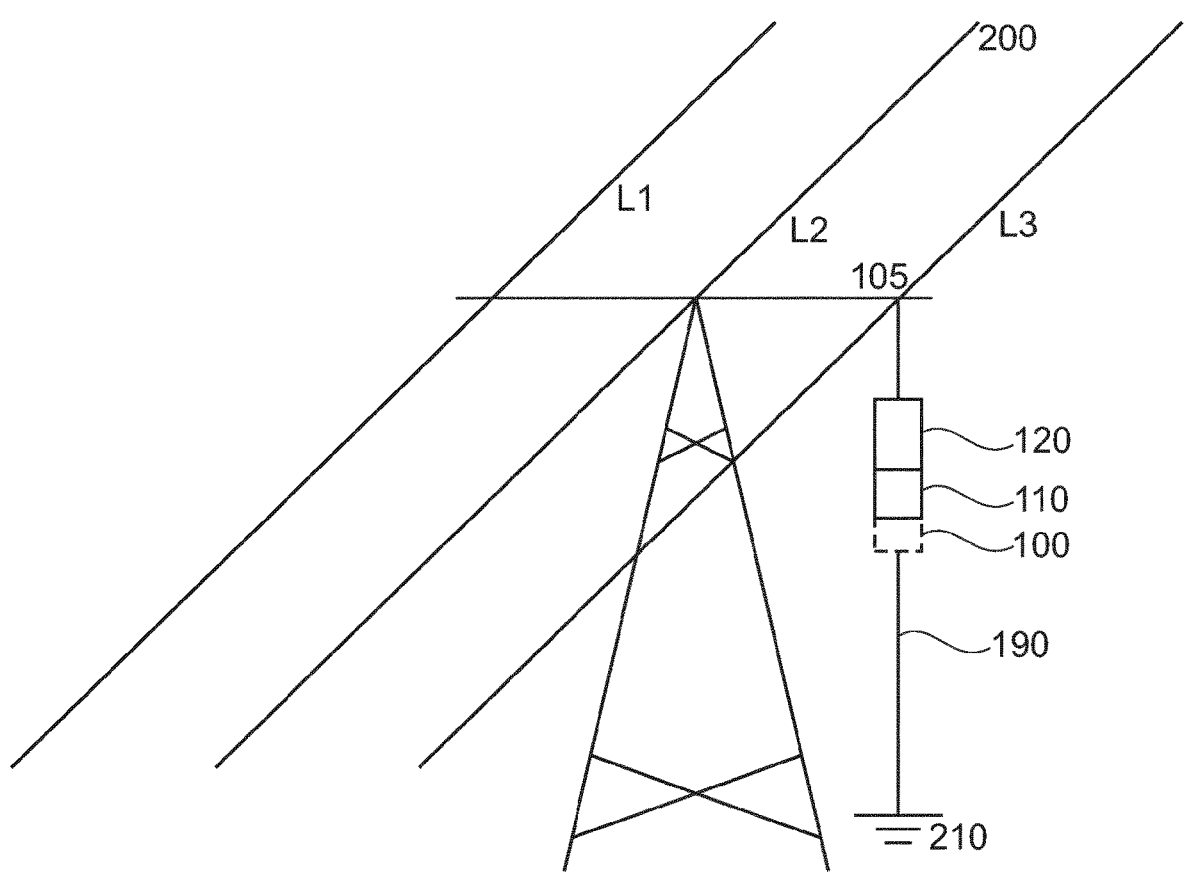
FIG. 2 schematically shows a section of a power grid with protecting devices according to embodiments.

FIG. 2 schematically shows a section of a power grid 200 according to embodiments. For reasons of simplicity, details like insulators are not shown in the drawings. L1 to L3 are power lines of the power grid 200. Exemplarily, pole-mounted equipment such as a surge arrester 120 and a disconnector device 110 are connected in series between a phase 105 (here L3) of the power grid 200 via ground cable 190 to ground 210. Herein, pole-mounted equipment is equipment that is adapted to be mounted to a pole of the power grid, and that is to be mounted to the pole during operation. In some embodiments, the pole-mounted equipment is adapted to be connected to a phase of the grid. In particular aspects of the invention, the term "pole-mounted equipment" may be replaced by at least one of a surge arrester and a distribution transformer.

In case of an overvoltage surge caused by, e.g., a lightning strike, the surge arrester 120 establishes a connection to ground 210 and thereby allows energy of the overvoltage to dissipate to ground, thus limiting effects of the overvoltage surge. However, as mentioned above, the surge arrester 120 may overload as described above. In order to avoid such an overload, the disconnector device 110 will, in case of an overload condition, interrupt the connection between L3 (phase 105) of the grid 200 and ground 210. This interruption is also referred to as activation of the disconnector device 110. Thereby, the current flow through the surge arrester is interrupted. Similarly, the disconnector device 110 may also allow avoiding an overload of other pole-mounted equipment than a surge arrester 120. The power distribution or transmission grid 200 and/or the pole-mounted equipment 120 may be rated for high voltage, at least 1 kV, in some embodiments more than 10 kV. In case of a distribution transformer, the rated voltage refers to the higher-voltage side of the transformer.

Further, a connection status monitoring device 100 is attached to the disconnector device 110. The connection status monitoring device 100 determines whether the disconnector device 110 has been activated; generates connection status indicator data, indicative of whether the disconnector device 110 has been activated; and transmits the connection status indicator data over a wireless communication infrastructure. Embodiments of such a connection status monitoring device 100 are described in the following.

FIG. 1 schematically shows a connection status monitoring device 100 and a wireless infrastructure 150. Further, by means of example, a central unit 155 and a cloud 157 are connected with the wireless infrastructure 150.

The connection status monitoring device 100 shown in FIG. 1 comprises a number of elements, some of which are optional, including a determining section 130 with an interaction element 170 in the determining section 130, a wireless communication section 140, a position detection system 180 and an energy supply 160.

In case a disconnector device 110 (not shown in this FIG. 1) disconnects, an indicator element (not shown in FIG. 1, see for example element 310 in FIG. 3) in the disconnector device 110 interacts with the interaction element 170 of the disconnector device 110. This interaction may notify the determining section 130 about a status change in the disconnector device 110 from "connected"/"inactivated" to "disconnected"/"activated".

The determining section determines, from this signal from the interaction element, whether the disconnector device 110 has been activated, and generates connection status indicator data, indicative of whether the disconnector device 110 has been activated. The connection status indicator data can be, for example, represented by a bit or some other data field indicating an activated or inactivated status.

This connection status indicator data is then outputted to wireless communication section 140, which transmits the information wirelessly over a wireless communication infrastructure 150, e.g., to the central unit 155 and/or to the cloud 157, where it may be processed for further use.

In an exemplary embodiment, the connection status monitoring device 100 further includes a position detection system 180. The position detection system 180 determines the current position of the connection status monitoring device 100 from a positioning system, e.g. a satellite positioning system like GPS or any other satellite-based positioning detection system. The position can be transmitted over the wireless communication infrastructure 150 as well.

An in-built energy supply 160, in form of a battery, an accumulator, an energy harvesting system or the like provides energy to the connection status monitoring device 100. The energy supply 160 can be capable of outputting a status of the contained energy. This status can then also be transmitted from the wireless communication section 140 over the wireless communication infrastructure 150.

Figure 3:
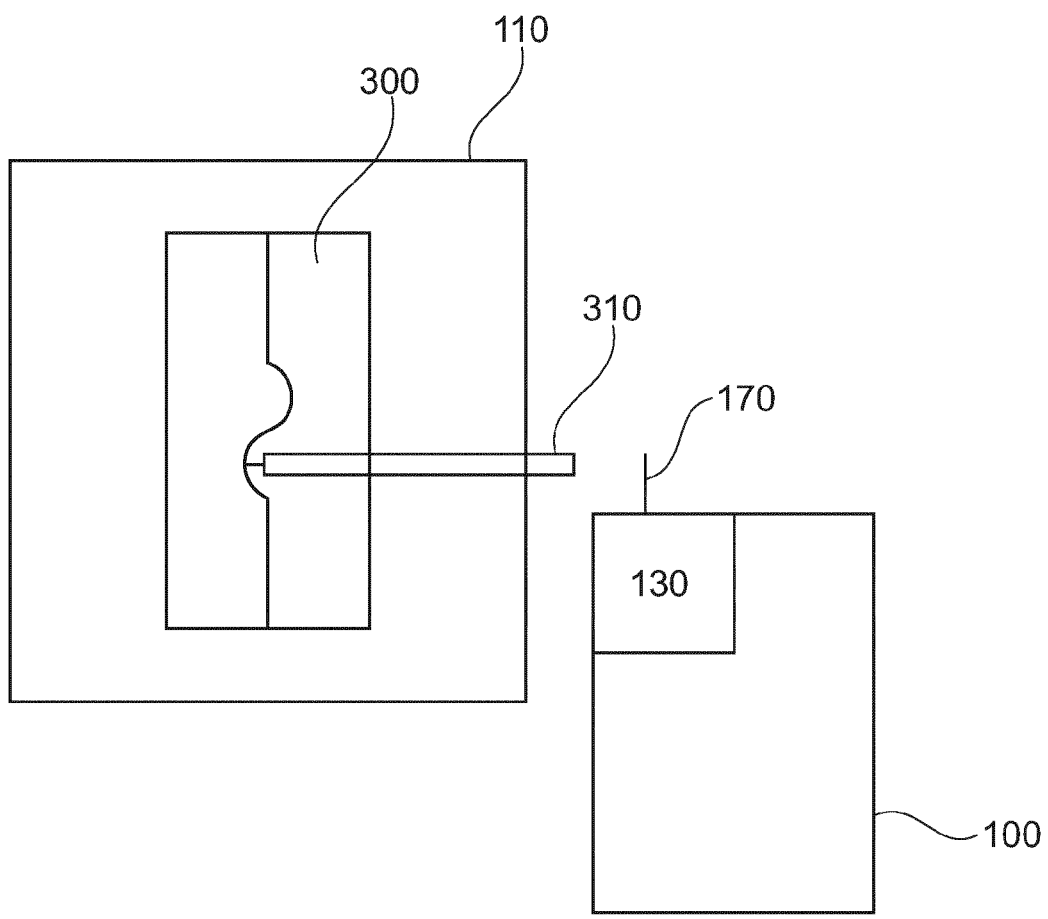
FIG. 3 schematically shows an exemplary detail of a disconnector device according to an embodiment.

FIG. 3 shows an embodiment of a protection disconnector system including the connection status monitoring device 100 described above and a disconnector device 110. Reference number 300 represents a fuse element of the disconnector device 110, which is known and not further described here. The fuse element 300 is coupled with an indicator element 310. The indicator element 310 may come in physical contact with an interaction element 170 in determining section 130 and may be dislocated, thereby signalizing the connection status monitoring device 100 that the disconnector device 110 has changed its status from "connected" to "disconnected". Determining section 130 is located in this embodiment in the connection status monitoring device 100. FIG. 4a, b shows another example of an interaction between indicator element 310 of disconnector device 110 and interaction element 170 of determining section 130 in connection status monitoring device 100. In FIG. 4a, the disconnector device is in a closed position. Indicator element 310 is spaced from interaction element 170, which is in determining section 130. In FIG. 4b, the disconnector device 110 has "tripped" i.e. the electrical connection of current path between a phase (e.g. phase 105) grid 200 and ground 210 is interrupted. Interaction element 170 in determining section 130 is dislocated by indicator element 310. The indicator element 310 can for example be a solid element (possibly conductive and/or magnetic), and interaction element 170 can be any proximity sensor for example comprising a photoelectric, inductive, magnetic and/or contact sensor system.

Figure 4:
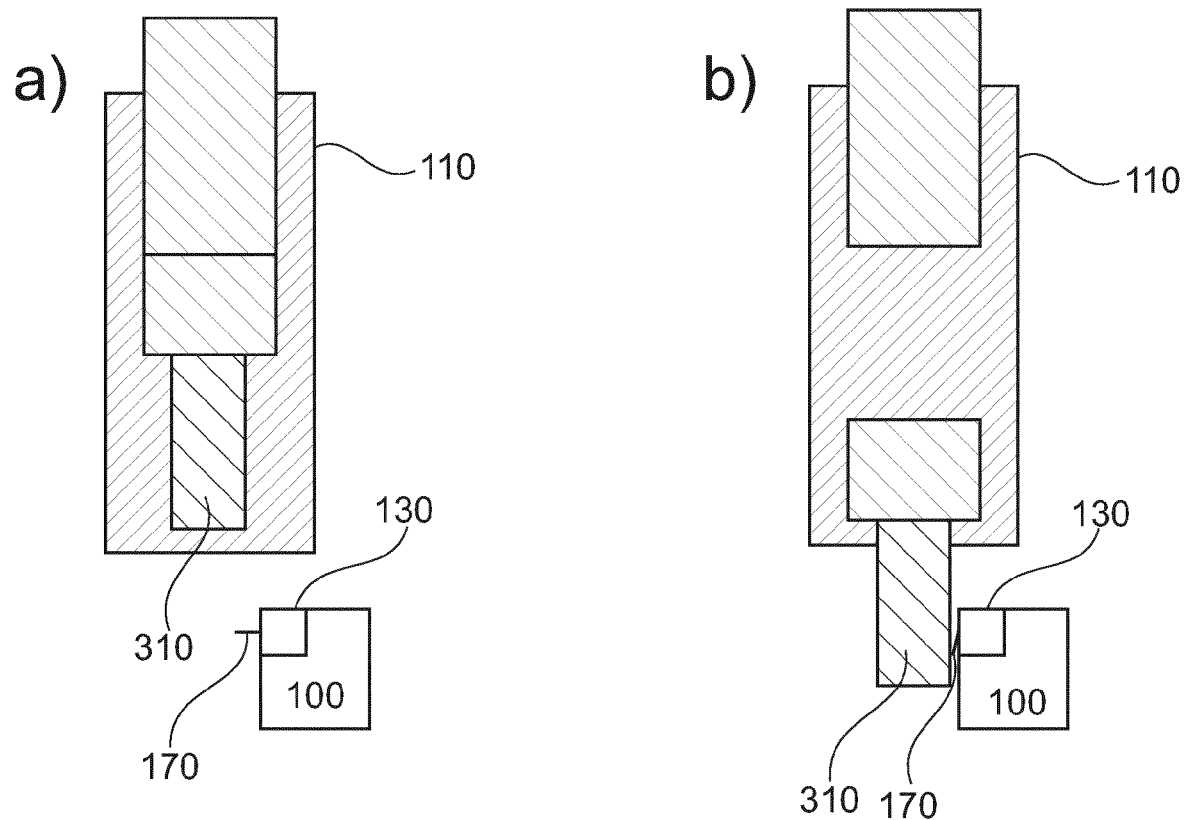
FIG. 4 schematically shows an exemplary embodiment.
Figure 5:
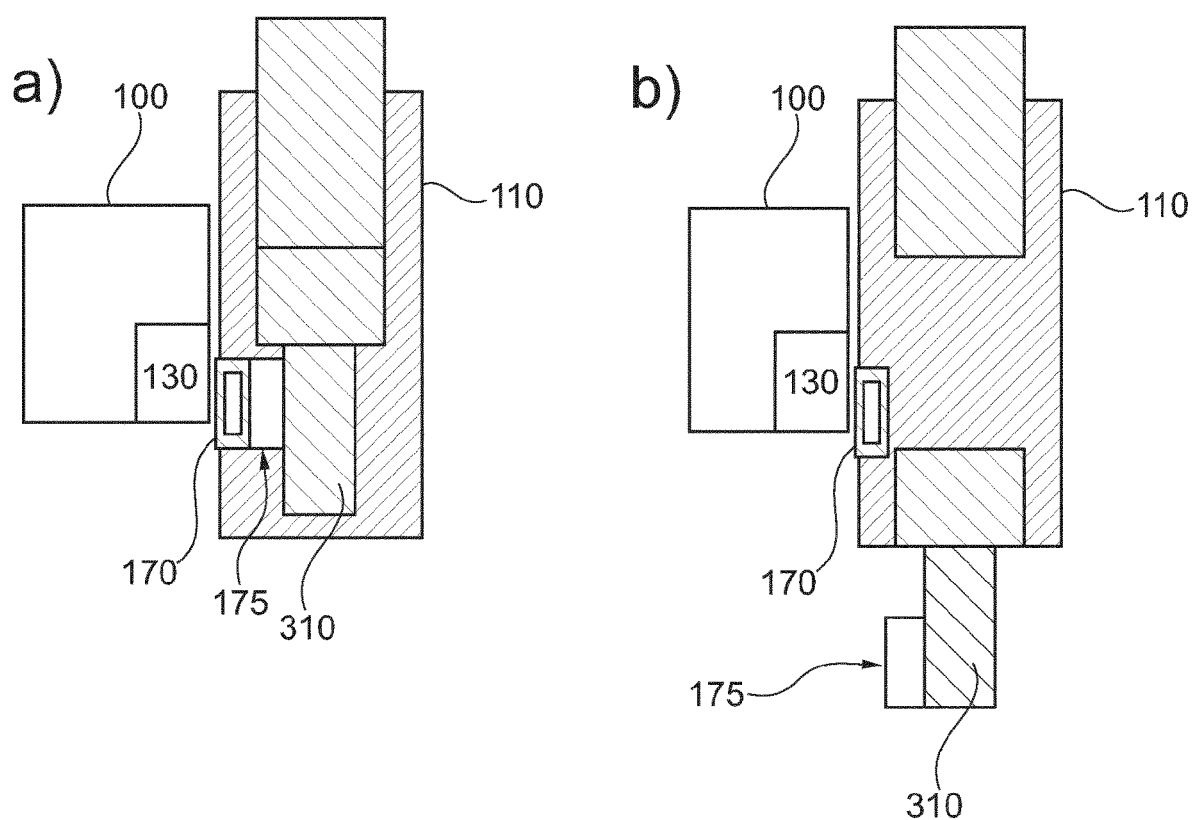
FIG. 5 schematically shows another exemplary embodiment.

FIG. 5a, b shows a more specific example of FIG. 4a, b. Here, interaction element 170 and indicator element 310 mutually interact without physical contact. Interaction element 170 in FIG. 5a may be provided in form of a magnetically controllable switching element. Such a switching element may be available e.g., but not limiting, in form of a reed-relay. In FIG. 5 a, the magnetically controllable switching element is close to a magnet 175, attached on the indicator element 310. The interaction element 170 is "closed" and the disconnector device 110 is in a connected state.

In FIG. 5b, the disconnector device 110 has been activated (i.e., is disconnected or has "tripped") and magnet 175 is spaced from the interaction element (reed relay) 170. The interaction element 170 is therefore open. This signal is read out by determining section 130 in connection status monitoring device 100 and further signalled to the wireless communication infrastructure as described above.

DETAILED DESCRIPTION OF FURTHER EMBODIMENTS AND ASPECTS

Hereinafter, further aspects, details and illustrative embodiments are described. It should be understood, all these embodiments are given merely for the skilled in the art to better understand and further practice the present disclosure, but not for limiting the scope of the present disclosure. For example, features illustrated or described as part of one embodiment may be used with another embodiment to yield still a further embodiment. In the interest of clarity, not all features of an actual implementation are described in this specification. It will of course be appreciated that in the development of any such actual embodiment, numerous implementation-specific decisions should be made to achieve the developers' specific goals Here, reference signs refer jointly to the Figures described above, but are merely meant as illustration but not as limiting the description to the embodiments shown in these Figures.

The proposed solution may provide automatic sensor-based monitoring of disconnector devices 110 (SPUs). The main technical challenge is to reliably detect the current state of a disconnector device 110 (SPU-state detection) or the transition from connected to disconnection state (event detection). At the same time, the sensing system should consume as little power as possible in order to prolong battery lifetime.

The main benefit of the proposed application is to enable the monitoring of a disconnector device 110 even in remote locations where it is not feasible to perform manual inspection on a regular basis.

The present application may disclose a remote monitoring approach of a disconnector device 110, in particular an SPU (Spark Prevention Unit), which may use one or more in-built sensing mechanisms, to collect a triggering or status information of the disconnector device and forward status information and disconnection events to a central unit 155 using wireless communication (e.g. LoRaWAN, RFID, Bluetooth, Wifi, Narrowband IoT, NBIOT, Sigfox, LTE CAT MI etc. ... ).

A solution may be to equip each disconnector device 110, or group of disconnector devices 110, with sensors and optionally with wireless connectivity that may connect to a wireless communication infrastructure 150.

In some embodiments, a connection status monitoring device 100 for monitoring an electrical connection status of a disconnector device 110 may be disclosed.

The disconnector device 110 may be connectable to pole-mounted equipment 120 in a power distribution or transmission grid 200, thereby adapted to disconnect the pole-mounted equipment 120.

The pole mounted equipment 120 may be an equipment configured for protecting a power distribution or transmission grid 200 from damage in case of a power surge, such as a surge arrester 120, or a distribution transformer. The disconnector device 110 may be connected in series to the pole-mounted equipment 120 (surge arrester respectively).

The pole-mounted equipment 120 may have a first and a second terminal, wherein the first terminal is electrically connectable to the power distribution or transmission grid 200.

The disconnector device 110 may have a third and a fourth terminal, wherein the third terminal may be electrically connected to the second terminal of the pole-mounted equipment (surge arrester) 120, the fourth terminal may be electrically connected, via a grounding cable 190, to ground 210.

Operating conditions of the disconnector device 110 may be continuously monitored using ambient sensors (e.g. temperature and humidity). In case that the pole mounted equipment 120 is a surge arrester, the disconnector device 110 may be connectable in a grounding path between a line, also considered as phase 105, of the power distribution or transmission grid 200 and ground 210, and being configured to be activated in case of an overload condition on the disconnector device 110, thereby disconnecting the pole-mounted equipment 120 from the grid 200 or from ground 210.

An overload condition, as it is considered in the present application, may be in terms of magnitude, duration, or combination of both, of the current/power, flowing through the disconnector device. This may be e.g., an overcurrent, resulting e.g. from a lightning strike, through the disconnector device 110, such that the current exceeds an overcurrent threshold for the magnitude and, optionally, for the duration of the overcurrent, or any other condition, indicating a risk of thermal overload of the disconnector device (and of the connected surge arrester 120 respectively).

A non-limiting example for such a disconnector device 110 may be a consumable fuse element, adapted to change from an unconsumed state to a consumed state in an operating state of the disconnector device 110. The connection status monitoring device 100 can be adapted for determining whether the fuse element has blown, i.e., has been activated.

The connection status monitoring device 100 may comprise a determining section 130 which may be configured to determine, whether the disconnector device 110 has been activated and to generate connection status indicator data. The connection status indicator data may be indicative of whether the disconnector device 110 has been activated, which means that it has disconnected the pole-mounted equipment 120 from the grid or from ground 210.

The connection status indicator data may be not determined by their bit sequence or the like but by its information content, i.e., indicating whether the disconnector device 110 has been activated. The connection status indicator data may, for example, be analogue data, in form of a voltage or a switching state as they may be presented by the sensing methods. The connection status indicator data may be transformed on their way from the determining section 130 to the wireless communication section 140, as long as the information content is preserved.

The connection status monitoring device 100 may further comprise a wireless communication section 140. The wireless communication section 140 may be adapted to connect to a wireless communication infrastructure 150 using a wireless communication protocol, and to transmit the connection status indicator data over the wireless communication infrastructure 150.

Optionally, the indicator data can be transmitted to a receiving unit directly or indirectly connected to the wireless communication infrastructure 150, e.g., a central unit 155 or a cloud 157. The wireless communication infrastructure 150 may be a low-energy wireless infrastructure, supporting low-energy transmission of data, such as, but not limiting, a LoRaWAN-based network. For transmitting data, a used transmission energy for the data may be in the range of at least IpWh and/or at most ImWh per transmission.

The wireless communication infrastructure 150 may be connected to a data network, such as a global data network. The data network may be an Ethernet network using TCP/IP such as LAN, WAN or Internet. The central unit 155 may comprise distributed storage units such as Cloud 157. Depending on the application, the Cloud 157 can be in form of public, private, hybrid or community Cloud.

In another embodiment of the application, the connection status monitoring device 100 according to embodiments, may further comprise an energy supply 160 such as a battery or an energy harvesting system.

The energy supply 160 may allow the connection status monitoring device 100 to operate independent from a power net or any external power supply. The energy supply 160 can be, e.g., a rechargeable energy supply 160 such as a battery; the energy supply 160 may also comprise an energy harvesting system, in particular photovoltaic cells or a circuit arrangement for harvesting energy from a current flowing through the disconnector device 110. The energy harvesting system may optionally be adapted to charge/recharge a rechargeable energy supply 160.

In another embodiment of the present application, the connection status monitoring device 100, according to one or more embodiments of the present application, may be further adapted to establish a multi-hop network with at least one neighboring connection status monitoring device 100. This may be such as a mesh network; the multi-hop network may also have a line-like topology in which at least a part of nodes may be connected to its two nearest neighbors.

In areas where a connection status monitoring device 100 is not within range of any existing communication infrastructure 150, other connection status monitoring devices 100 may serve as recipients of data messages, which are then forwarded along multiple hops of an ad-hoc or mesh wireless network towards a fixed infrastructure (e.g. gateway) and a central unit 155. In this scenario, communication slots between neighboring monitoring devices can be coordinated based on a time signal from e.g. the gateway. This improves the transmission of the data messages.

In another embodiment of the connection status monitoring device 100 according to one or more embodiments, the determining section 130 may comprise at least one interaction element 170 of a non-limiting group of: an electrical switch, e.g. having a magnetic or mechanical switch actuator, an acceleration sensor, a photoelectric barrier.

The interaction element 170 may be adapted for interacting with the disconnector device 110 upon activation of the disconnector device 110. This interaction between interaction element 170, arranged at the determining section 130 of the connection status monitoring device 100 and indicator element 310 in the disconnector device 110 is illustrated in FIGS. 3 to 5.

Interaction elements 170, which may be used for the determining section 130 are described in more detail in the following:

A magnetic switch as a sensing method is based on the fact that a position of the electrode and the indicator rod 310 (see FIGS. 4 and 5) changes when the SPU is disconnected. Consequently, a magnetic sensor (e.g. a Reed relay/switch) may be used to detect a change in position of the electrode/indicator 310. This can be realized, for example, by attaching a small magnet to the indicator rod 310 (FIG. 5), which keeps the magnetic switch closed as long as the SPU is disconnected. As soon as the SPU is disconnected, the magnetic switch will be opened since the magnet may no longer be in proximity to the switch, as shown in FIG. 5.

The state of the switch (open/close) can be monitored by an electronic circuit or using a microcontroller. The advantage of this approach is that the magnetic switch is a passive electrical component and that the SPU stays in disconnection position once disconnected. This solution thus does not consume any power.

In an alternative case, the Reed-switch state can be swapped with respect to FIG. 5 (this may require different positioning of the switch and magnet or different switch architecture): the Reed-switch (Reed-relay) is closed when the disconnector device 110 (SPU) is open. If the Reed-switch is used to control the power flow in the electronics, this particular configuration allows for extreme power saving. The electronics may be only powered when the disconnector device 110 is disconnected. Status and other information are transmitted then.

An acceleration sensor as sensing method is based on the fact that electrode and indicator element 310 (visual indicator) are subject to relatively large acceleration in the moment when the disconnector device 110 (SPU) is in a process of disconnecting. Therefore, an acceleration sensor built into or attached to the electrode or indicator element 310, as can be derived from FIG. 5, will be able to measure the increase in acceleration (compared to normal gravity) during disconnection event.

With an electric switch/breaking a wire as sensing method, the status of the disconnector device 110 (SPU) (connected/disconnected) is detected either by an electrical switch or an electrical wire that breaks when the disconnector device 110 has disconnected. Thereby, the electrical switch can either be hold in the closed or open position when the disconnector device 110 is disconnected (e.g. by physical contact between an electrode/indicator 310 and a switch or absence of physical contact). In a similar way, an electrical wire may be used as a "one-time switch" that may be usually closed (current can flow through the wire) and may be opened by breaking the wire (no current can flow anymore) when the disconnector device 110 disconnects.

The connection status monitoring device 100 may have a clamp-on section for clamping onto the disconnector device 110 and/or onto a grounding connection, like a grounding cable 190, connecting the disconnector device 110 to ground 210. This may advantageously enable, that disconnector devices 110, which are already in use, but not equipped with monitoring capabilities, may be easily be equipped (retro-fit) with connection status monitoring devices 100, to make even existent disconnector devices ready for monitoring.

In another embodiment, the connection status monitoring device 100 according to one or more embodiments, may further comprise a position detection system 180. The position detection system 180 may further be adapted to detect a geographic position of the connection status monitoring device 100.

The position detection system 180 may be a satellite-based positioning system for obtaining a geographic location of the connection status monitoring device 100. Alternatively, a positioning portion of the wireless communication section 140 may be configured for obtaining position information through interaction with the wireless communication infrastructure 150, and/or a reading device for reading position information available from equipment of the power distribution or transmission grid 200.

The geographic position may be an absolute position, e.g., given in coordinates, like longitude and latitude values or may be a relative position, e.g., a distance from a gateway of the communication infrastructure 150, from a neighboring communication section, a distance along a transmission or distribution line, a pole number of a transmission or of a distribution line, or the like. The geographic position may be any information allowing to determine the position of the device, e.g., on a map. Examples of such a geographic position may be a pole identifier (number) or a line position.

The wireless communication section 140 may further be adapted to transmit a position data indicative of the detected geographic position to the wireless communication infrastructure 150.

In another embodiment of the connection status monitoring device 100 according to one or more embodiments of the application, the wireless communication section 140 may further be adapted to communicate with at least one node of the wireless communication infrastructure 150. A node in the sense of the present application may be a neighboring device, a gateway, a router or a base station. The wireless communication infrastructure 150 may be adapted to determine a geographic position of the device based on characteristics of at least one signal received by the at least one node.

Such characteristics may be a signal strength, which nodes have received signals, time of flight. Optionally, determining may be in accordance with any triangulation or other known method for that purpose.

In another embodiment, the connection status monitoring device 100 according to one or more embodiments of the application may further be adapted to determine further data.

The further data may be indicative of at least one selected from a status and an event. Data indicative of a status and/or an event may be a status and/or an event of the disconnector device 110, of the pole-mounted equipment 120, of the power distribution or transmission grid 200 and/or of the wireless communication infrastructure 150. The status may be an energy supply 160 status; a health status; an operating state. The event may be a change in any status.

The wireless communication section 140 of the connection status monitoring device 100 may be adapted to transmit the further data over the wireless communication infrastructure 150.

The sensing unit of the disconnector device 100 may periodically report its status and any observed events using the wireless communication infrastructure 150 to the central unit 155. In order to save energy, communication i.e. data transfer may only happen infrequently or at a pre-defined point in time, e.g. during specific, calculated time (communication) slots.

Communication slots between the sensing unit and another wireless transceiver can be synchronized based on a real-time clock, which is provided by the GNSS module, in order to save energy.

In another embodiment, the connection status monitoring device 100 according to one or more embodiments of the present application may disclose that the wireless communication section 140 may be adapted to transmit the connection status indicator data according to any one of the following:

the wireless communication section 140 may be adapted to transmit the connection status indicator data with a transmission energy use of at least lpWh and/or at most lmWh per transmission;

the wireless communication section 140 is adapted to transmit the connection status indicator data
a) in predetermined time intervals, in particular at least once a day and at most once an hour, b) upon an event, c) upon a change in status, or d) any combination of a-c;

the wireless communication section 140 may be adapted to transmit the connection status indicator data with a bit rate of at least 50 bit/s and/or at most 1 MBit/s; and any combination of the above.

The wireless communication section 140 may further be adapted to transmit a communication status report, further data and/or the position data in one or more output data package(s).

In a embodiment, the connection status monitoring device 100 may be adapted to transmit the position data to the wireless communication infrastructure 150 when the connection status monitoring device 100 is activated the first time or after a maintenance. The position may be sent, when the connection status monitoring device 100 is powered on automatically or after manually activation from maintenance personnel.

The transmission may be not bi-directional. In other words, the wireless communication section 140 may only send in direction to the wireless infrastructure 150, but cannot receive data, sent from the wireless infrastructure 150. A transmission between connection status monitoring devices 100 may be possible, such as when the connection status monitoring devices 100 act as a node and form a mesh network.

In another embodiment, a connection status monitoring system may be disclosed. The connection status monitoring system may comprise the connection status monitoring device 100 according to one or more embodiments of the present application; and a central control unit 155, connected to the wireless communication infrastructure 150, as can be seen in FIG. 1, using the wireless communication protocol. The wireless communication protocol is a digital protocol. The central control 155 unit may be cloud-based, but may also be a distributed system.

The central control unit 155 may possibly be connected to the wireless communication infrastructure 155 through further network components such as a gateway, wherein these further network components may include a non-wireless network portion.

The central control 155 unit may be adapted to receive the connection status indicator data and optionally other data, e.g. packet data, transmitted by the wireless communication section 140 or possibly transmitted through the further network components.

In another embodiment of the present application, a protection disconnector system for disconnecting a pole-mounted equipment 120 in a power distribution or transmission grid 200 may be disclosed.

The protection disconnector system may comprise a disconnector device 110, being connectable to the pole-mounted equipment 120 and being configured for disconnecting the pole-mounted equipment 120, upon activation of the disconnector device 110, in case of an overload condition. An overload condition, as it is considered in the present application, may be in terms of magnitude, duration, or combination of both, of current/power, flowing through the disconnector device 110. This may be e.g., an overcurrent through the disconnector device 110, resulting e.g. from a lightning strike, such that the current exceeds an overcurrent threshold for the magnitude and, optionally, for the duration of the overcurrent, or any other condition, indicating a risk of thermal overload of the disconnector device 110 (and of the connected surge arrester 120 respectively).

The protection disconnector system, in this case, may disconnect the pole-mounted equipment 120 e.g. from the power distribution or transmission grid 200 or from ground 210.

The protection disconnector system may further comprise the connection status monitoring device 100 or the connection status monitoring system according to one or more embodiments of the present application. The connection status monitoring device 100 may be operatively connected to the disconnector device 110 for monitoring an electrical connection status of the disconnector device 110.

The connection status monitoring device 100 in the protection disconnector system may further be adapted to determine health status indicator data indicative of a health status, e.g., a health status of the energy supply 160 or of the disconnector device 110 or of another part of the protection disconnector system. The health status may optionally include a charging status of the battery. The wireless communication section 140 in the connection status monitoring device 100 may be adapted to transmit health status indicator data over the wireless communication infrastructure 150.

In another embodiment of the present application, the protection disconnector system according to one or more embodiments may disclose, that the disconnector device 110 may comprise an indicator element 310 for indicating activation of the disconnector device 110. This may be such as a movable indicator element 310, adapted for moving upon activation of the disconnector, as exemplary shown in FIGS. 3 to 5.

The protection disconnector system may further comprise that the determining section 130 may have at least one interaction element 170. The interaction element 170 may be adapted for interacting with the indicator element 310 of the disconnector device 110 upon activation of the disconnector device 110. The interaction element 170 may be from the group: an electric switch (with mechanical or magnetic actuator), an acceleration sensor, a photoelectric barrier.

In another embodiment of the present application, the protection disconnector system according to one or more embodiments, the disconnector device 110 may be adapted to be activated for disconnecting the pole-mounted equipment 120, e.g., from the power distribution or transmission grid 200 or from ground 210, in case of an overload condition.

An example for such a disconnector device 110 may be a consumable fuse element, adapted to change from an unconsumed state to a consumed state in an operating state of the disconnector device 110. This may be an explosive fuse or a fuse having a conductor element, such as a wire with a defined melting temperature that melts upon experiencing an overcurrent. The connection status monitoring device 100 may be adapted for determining whether the fuse element has blown. In other words, to determine, if it has been activated.

In another embodiment of the present application, a grid 200 protection system may be disclosed. The grid 200 protection system may comprise at least one pole-mounted equipment 120, which may be connected to a power distribution or transmission grid 200. The pole-mounted equipment 120 may be a distribution transformer or an equipment configured for protecting a power distribution or transmission grid 200 from damage in case of a power surge, such as a surge arrester with a predefined trigger threshold.

The grid 200 protection system may further comprise the protection disconnector system according to one or more embodiments of the present application. The disconnector device 110 may be electrically connected to the pole-mounted equipment 120 and may further be configured for disconnecting, upon activation of the disconnector device 110, the pole-mounted equipment 120 in case of an overload condition.

In another preferred embodiment, the grid protection system according to one or more embodiments of the application may disclose that the pole-mounted equipment 120 may be electrically connected, through the disconnector device 110, between a line (i.e. a phase 105) of the power distribution or transmission grid 200 and ground 210 as is evident from FIG. 1.

According to another embodiment of the present application, a method for remotely monitoring an electrical connection status of a disconnector device 110 may be disclosed.

The disconnector device 110 may be connected to a pole-mounted equipment 120 in a power distribution or transmission grid 200 and may further be configured for being activated in case of an overload condition, thereby disconnecting the pole-mounted equipment 120 from the grid 200 or from ground 210.

The method may comprise the steps of determining, by a determining section 130 of the connection status monitoring device 100, whether the disconnector device 110 has been activated. The determining section 130 may generate connection status indicator data, which are indicative of whether the disconnector device 110 has been activated.

The method may further comprise that a wireless communication section 140 of the connection status monitoring device 100, which is connected to a wireless communication infrastructure 150, transmits the connection status indicator data over the wireless communication infrastructure 150 using a wireless communication protocol. The wireless communication protocol is a digital protocol.

The wireless communication infrastructure 150 may be connected to a data network, such as to a global data network or to a central unit 155. The data network may be an Ethernet network using TCP/IP such as LAN, WAN or Internet. The central unit 155 may optionally comprise distributed storage units such as Cloud 157. Depending on the application, the Cloud 157 may be provided in form of a public, private, hybrid or community Cloud.

The central unit 155 may optionally be configured to output any alerts/events/status changes, transmitted with the data according to any of the previous embodiments, to an operator. The central unit 155 may optionally display such an output on a map, e.g. on a display, using position information, contained in the transmitted data, to visualize to maintenance personnel, where a disconnector device has been activated.

The method may optionally comprise to determine the connection status indicator data and transmitting the connection status indicator data over the wireless communication infrastructure 150 in predetermined time intervals and/or on recognition of a change in status and/or of an event.

The wireless communication section 140 may have a maximum transmission power, and maybe configured to transmit the connection status indicator data (and any other data) over the wireless communication infrastructure 150 using an actual transmission power being only a (selectable) fraction of the maximum transmission power.

The actual transmission power may be selected to be higher than a lower threshold defined for a guaranteed successful transmission over the wireless communication infrastructure 150. The actual transmission power may be selected to be lower than an upper threshold defined for the connection status monitoring device to reach a predetermined lifetime of a power supply such as a battery.

A battery lifetime between 1 and 20 years with one transmission per day may be assumed. Battery usage per transmission may be between a lower limit of 0.1% o (permille) of the nominal battery energy content and an upper limit of 3% o (permille) of the nominal battery energy content.

The invention claimed is:
1. A protection disconnector system comprising:
a surge arrestor;
the surge arrestor being connectable to a power distribution or transmission grid;
a disconnector device;
the disconnector device being connected in series to the surge arrester between a phase of the power distribution or transmission grid and ground;
the disconnector device being configured for disconnecting, upon activation of the disconnector device, the surge arrester in case of an overload condition of the surge arrestor;
a connection status monitoring device;
the connection status monitoring device being operatively connected to the disconnector device for monitoring an electrical connection status of the disconnector device;
the connection status monitoring device comprising a determining section and a wireless communication section;
the determining section being configured to determine whether the disconnector device has been activated and to generate connection status indicator data, indicative of whether the disconnector device has been activated;
the wireless communication section being adapted to connect to a wireless communication infrastructure using a wireless communication protocol, and to transmit the connection status indicator data over the wireless communication infrastructure;
the disconnector device comprising an indicator element which is movable;
the determining section comprising an interaction element;
the indicator element being moved in response to the disconnector device being activated;
the interaction element interacting with the indicator element and generating a signal in response to a movement of the indicator element; and
the determining section determining that the disconnector device has been activated in response to receiving the generated signal.

2. The protection disconnector system according to claim 1, whereby the disconnector device is provided as a consumable fuse element, adapted to change from an unconsumed state to a consumed state in an operating state of the disconnector device and the fuse element is provided as an explosive fuse or as a fuse having a wire as conductor element, whereby the wire has a defined melting temperature that melts upon experiencing an overcurrent.

3. The protection disconnector system according to claim 1, further comprising an energy supply such as a battery or an energy harvesting system.

4. The protection disconnector system according to claim 1, further adapted to establish a multi-hop network with a neighbouring connection status monitoring device.

5. The protection disconnector system according to claim 1, wherein the interaction element is of the group of: an electrical switch, an acceleration sensor, a photoelectric barrier, wherein the interaction element is adapted for interacting with the disconnector device upon activation of the disconnector device.

6. The protection disconnector system according to claim 1, further comprising a position detection system adapted to detect a geographic position of the connection status monitoring device, and wherein the wireless communication section is further adapted to transmit a position data indicative of the detected position to the wireless communication infrastructure.

7. The protection disconnector system according to claim 1, wherein the wireless communication section is further adapted to communicate with at least one node of the wireless communication infrastructure.

8. The protection disconnector system according to claim 1, further adapted to determine further data, indicative of at least one selected from a status and an event, and wherein the wireless communication section is adapted to transmit the further data over the wireless communication infrastructure.

9. The protection disconnector system according to claim 1, wherein
the wireless communication section is adapted to transmit the connection status indicator data with a transmission energy use of at least 1 µWh and/or at most 1 mWh per transmission; and/or
the wireless communication section is adapted to transmit the connection status indicator data with a bit rate of at least 50 Bit/s and/or at most 1 Mbit/s; and/or
the wireless communication section is adapted to transmit the connection status indicator data a) in predetermined time intervals, in particular at least once a day and at most once an hour, b) upon an event, c) upon a change in status, or d) any combination of a-c.

10. The protection disconnector system according to claim 1, wherein the surge arrestor is provided as pole-mounted equipment.

11. The protection disconnector system according to claim 1, comprising a central control unit connected to the wireless communication infrastructure using the wireless communication protocol and adapted to receive the connection status indicator data, transmitted by the wireless communication section.

12. The protection disconnector system according to claim 1, whereby the disconnector device is provided as a consumable fuse element, adapted to change from an unconsumed state to a consumed state in an operating state of the disconnector device and the fuse element is provided as an explosive fuse or as a fuse having a wire as conductor element, whereby the wire has a defined melting temperature that melts upon experiencing an overcurrent;

wherein the fuse element is coupled with the indicator element to come in physical contact with the interaction element in the determining section and, when the interaction element is dislocated, configured for signalizing the connection status monitoring device that the disconnector device has changed its status from "connected" to "disconnected".

13. The protection disconnector system according to claim 1, wherein the surge arrester is electrically connected, through the disconnector device, between a line of the power distribution or transmission grid and ground.

14. A method for remotely monitoring an electrical connection status of a disconnector device, the method comprising:

connecting the disconnector device in series to a surge arrester between a phase of a power distribution or transmission grid to ground;

activating the disconnector device in case of an overload condition of the surge arrestor, thereby disconnecting the surge arrester;

determining, by a determining section of a connection status monitoring device, whether the disconnector device has been activated;

generating, by the determining section, connection status indicator data indicative of whether the disconnector device has been activated;

connecting the connection status monitoring device to a wireless communication infrastructure;

transmitting, by a wireless communication section of the connection status monitoring device, the connection status indicator data over the wireless communication infrastructure using a wireless communication protocol wherein the disconnector device comprises an indicator element which is movable;

wherein the determining section comprises an interaction element;

wherein the indicator element is moved when the disconnector device is activated;

wherein the interaction element interacts with the indicator element and generates a signal when the indicator element is moved; and determining, by the determining section, that the disconnector device has been activated in response to receiving, by the determining section, the generated signal.

\* \* \* \* \*